(12) United States Patent
Gao et al.

(10) Patent No.: US 11,056,606 B2
(45) Date of Patent: Jul. 6, 2021

(54) PHOTODETECTOR AND METHOD OF MANUFACTURE

(71) Applicant: VISIONARY SEMICONDUCTOR INC., Waterloo (CA)

(72) Inventors: Zhen Gao, Waterloo (CA); Navid Mohammad Sadeghi Jahed, Waterloo (CA); Siva Sivoththaman, Waterloo (CA)

(73) Assignee: Visionary Semiconductor Inc., Waterloo (CA)

( * ) Notice: Subject to any disclaimer, the term of this patent is extended or adjusted under 35 U.S.C. 154(b) by 0 days.

(21) Appl. No.: 16/323,376

(22) PCT Filed: Aug. 4, 2017

(86) PCT No.: PCT/CA2017/000182
§ 371 (c)(1),
(2) Date: Feb. 5, 2019

(87) PCT Pub. No.: WO2018/023192
PCT Pub. Date: Feb. 8, 2018

(65) Prior Publication Data
US 2020/0235256 A1    Jul. 23, 2020

Related U.S. Application Data

(60) Provisional application No. 62/371,307, filed on Aug. 5, 2016.

(51) Int. Cl.
*H01L 29/732* (2006.01)
*H01L 31/109* (2006.01)
*H01L 31/0216* (2014.01)
*H01L 31/0224* (2006.01)
*H01L 31/0232* (2014.01)

(52) U.S. Cl.
CPC ...... *H01L 31/109* (2013.01); *H01L 31/02161* (2013.01); *H01L 31/02327* (2013.01); *H01L 31/022466* (2013.01)

(58) Field of Classification Search
None
See application file for complete search history.

(56) References Cited

U.S. PATENT DOCUMENTS 8,415,757 B2 * 4/2013 Forrest ............... B82Y 10/00
257/431
9,214,576 B2 12/2015 Fu et al.
(Continued)

OTHER PUBLICATIONS

Song et al.; Interfacial Structure and Current Transport Properties of Sputter-Deposited ZnO:Al/c-Si Heterojunction Solar Cells; 3rd World Conference on Photovoltaic Energy Conversion; May 11-18, 2003; pp. 1017-1020; Osaka, Japan.

*Primary Examiner* — Hung K Vu
(74) *Attorney, Agent, or Firm* — Reinhart Boerner Van Deuren P.C.

(57) ABSTRACT

The present invention teaches a structure of a photodetector and the method of making thereof. A photodetector inaccordance of the present invention is easy to fabricate, can be fabricated through low temperature processes, has high responsivity, high switching speed and high active area to device area ratio, is able to operate under photovotaic mode or reverse bias conditions.

11 Claims, 6 Drawing Sheets

(56) References Cited

U.S. PATENT DOCUMENTS

| | | | |
|---|---|---|---|
| 2012/0080676 A1* | 4/2012 | Forbes | H01L 31/02366 |
| | | | 257/53 |
| 2013/0199608 A1 | 8/2013 | Emeraud | |
| 2014/0034944 A1 | 2/2014 | Zan et al. | |
| 2015/0249170 A1* | 9/2015 | Snaith | H01L 31/1884 |
| | | | 136/256 |

* cited by examiner

PHOTODETECTOR AND METHOD OF MANUFACTURE

FIELD OF THE INVENTION

The present invention relates to photodiodes. More particularly, the present invention relates to photodetectors having a transparent conductive layer for receiving photons and a semiconductor substrate for detecting the received photons. The present invention also relates to methods of manufacturing a photodetector.

BACKGROUND OF THE INVENTION

Photodiodes have been well developed with a semiconductor P-N, P-I-N junctions, and a Metal-Semiconductor-Metal (MSM) Schottky junction. A P-N (or P-I-N) junction photodiode has a relatively low switching speed because of the relatively high reverse recovery time and built-in capacitance. Therefore, a strong reverse bias is normally applied to mitigate this problem and also to increase the photoresponsivity. However, the reverse bias requirement contributes to the energy budget and possible leakage to adjacent circuits with small circuit dimensions. Moreover, in P-N junction photodiodes, a heavily doped layer with one conductivity type on a lightly doped substrate with a different conductivity type is desired for a stronger junction and hence higher photo responsivity. However, heavy doping can enable more carrier recombination in the doped layer which may compromise the photon responsivity of the P-N photodiode.

Photodiodes based on a MSM Schottky junction have a higher switching speed than P-N junction photodiodes. The metal component of the MSM Schottky junction is, however, usually opaque and the distance between metal fingers needs to be relatively small. These factors restrict the size of the active region in conventional MSM Schottky junctions, which in turn limits their sensitivity. Furthermore, the region with the highest photo carrier collection efficiency in an MSM Schottky junction is located beneath the opaque metal component where it receives no incident light signal. Accordingly, the structure is inherently inefficient as the metal component creates an inactive region incapable of receiving photons in a region that is most efficient at photon collection.

An area of recent study is the use of heterojunction solar cells made up of a wide-bandgap transparent conductive oxide (TCO) on a single-crystal silicon (c-Si) wafer (See, for instance, Song, et al. "Interfacial Structure and Current Transport Properties of Sputter-Deposited ZnO:Al/c-Si Heterojunction Solar Cells", $3^{rd}$ World Conference on Photovoltaic Energy Conversion May 11-18, 2003, Osaka, Japan, hererinafter "Song et. al. 2003"). A problem with such heterojunctions are that they are inherently unsuitable for solar cell applications, as there has been a fundamental misunderstanding of their structural properties. Previous studies have treated such structures as P-N photodiodes, though part of the junction is formed of TCO, rather than a doped semi-conductor.

SUMMARY OF THE INVENTION

In an embodiment, a photodetector is provided. The photodetector comprised of a heterojunction formed from a transparent conductive oxide (TCO) layer for receiving incident photons and a semiconductor substrate for capturing and detecting the received photons. The semiconductor substrate including a depletion region formed adjacent to the TCO-semiconductor junction interface. In some implementations the depletion region further comprises an inversion region. In some embodiments the photodetector further comprises a TCO layer contact and a semiconductor substrate contact. In some implementations, the TCO layer thickness may be selected to minimize reflection of pre-determined wavelengths of incident light. In some implementations, the photodetector further comprises a bias applied between the TCO and the semiconductor substrate.

In an embodiment, a photodetector is provided. The photodector comprised of a heterojunction formed from a transparent conductive oxide (TCO) layer for receiving incident photons, an intermediary passivation layer, and a semiconductor substrate for capturing and detecting the received photons. The semiconductor substrate including a depletion region formed close to the passivation layer-semiconductor interface. In some implementations the depletion region further comprises an inversion region. In some embodiments the photodetector further comprises a TCO layer contact and a semiconductor substrate contact. In some implementations, the TCO layer thickness may be selected to minimize reflection of pre-determined wavelengths of incident light. In some implementations, the photodetector further comprises a bias applied between the TCO and the semiconductor substrate.

Other features and advantages of the present invention are described more fully below.

BRIEF DESCRIPTION OF THE DRAWINGS

Further features and advantages will become apparent from the following detailed description, taken in combination with the appended drawings, in which.

DETAILED DESCRIPTION OF THE INVENTION

Figure 1:
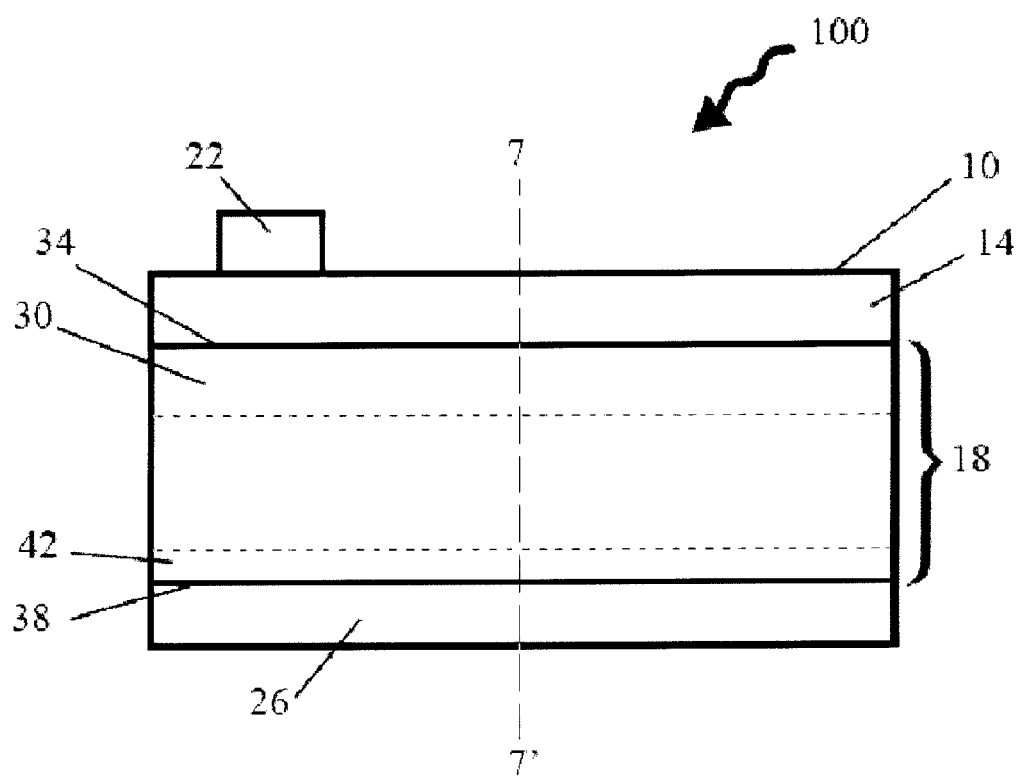
FIG. 1 shows a simplified sectional view of a photodetector in accordance with an embodiment of the present invention.

The inventors have surprisingly determined that a heterojunction comprised of a conductive TCO layer and a semiconductor substrate functions like a Schottky junction and not a P-N junction, as believed in the prior art. Since the heterojunction functions similar to a Shottky junction the energy bands are "pinned", producing current at low voltages when under illumination with incident photons. As a result, the heterojunction is unsuitable for solar power applications, due to the energy bands on either side of the junction being "pinned" to a low voltage output. Such heterojunctions are, however, surprisingly useful as photodetectors as their Shottky junction-like function allows them to include such features as improved responsivity, lower reverse recovery time, and/or higher switching speeds over P-N junctions, while retaining the P-N junction benefit of a relatively high active area to device area ratio as compared with conventional Shottky junctions. Furthermore, such a photodetector may be constructed to operate under low or no bias conditions, where desirable.

In an embodiment, a photodetector is provided. The photodetector including a transparent conductive oxide (TCO) layer for receiving incident photons and a semiconductor substrate for capturing and detecting the received photons. The TCO layer combined with the semiconductor substrate at a junction interface to form a heterojunction. A TCO layer thickness of the TCO layer selected to minimize reflection of one or more pre-determined wavelengths of the incident photons.

In an embodiment, a photodetector is provided. The photodetector including: a transparent conductive oxide (TCO) layer for receiving incident photons and a semiconductor substrate for capturing and detecting the received photons. The TCO layer combined with the semiconductor substrate at a junction interface to form a heterojunction. The photodetector further inlcuding a passivation layer located at the junction interface between the TCO layer and the semiconductor substrate.

In an implementation the photodetector further comprises a voltage bias applied across the heterojunction. In an implementation the voltage bias comprises a reverse bias.

In an implementation the semiconductor substrate is lightly doped n-type. In an implementation the semiconductor substrate is lightly doped p-type.

In an implementation the photodetector further comprises a depletion region in the semiconductor substrate adjacent to the junction interface. The depletion region may further comprise an inversion region. In some implementations, the voltage bias may be applied to create or expand the inversion region within the depletion region.

In an implementation, the photodetector further comprises a back surface field region of the semiconductor substrate opposite from the junction interface, wherein the back surface field region is more heavily doped, with a same dopant type, than a rest of the semiconductor substrate.

In an implementation, the photodetector further comprises a semiconductor contact covering a back surface of the semiconductor substrate, opposed from the junction interface. The semiconductor contact may further comprise a reflective material for reflecting the received photons back into the semiconductor substrate.

In an implementation of the photodetector at least one of: a photo-receptive surface of the TCO layer, a back surface of the semiconductor substrate opposed from the junction interface, and a semiconductor substrate surface at the junction interface, have been treated to improve at least one optical property of that surface. The at treatment may comprise, for instance, roughening or texturing the surface. The improved optical property may include at least one of improved transmission, improved reflection and/or improved retention of photons.

In an implementation the photodetector further comprises a passivation layer located at the junction interface between the TCO layer and the semiconductor substrate. In some implementations the passivation layer is less than about 10 nm thick. The passivation layer may be between about 1 nm and 2 nm thick. In some implementations, the passivation layer may be thicker than 10 nm. The passivation layer may, for instance, be between about 50 to 100 nm, or in some cases thicker than 100 nm where dark current reduction is of greater importance than reduction of current loss. The passivation layer may comprise, for instance, any of semiconductor oxide, metal oxide, doped metal oxide, semiconductor nitride, semiconductor compound, nanostructured material, amorphous thin film, crystalline thin film, organic thin film, graphene, graphene based thin film, graphene oxide, and silicon oxide.

In an implementation, the photo detector further comprises an optical layer located adjacent to the TCO layer, an optical layer thickness and optical layer index of refraction of the optical layer selected to optimize transmission of a pre-defined range of wavelengths of incident photons when the optical layer is combined with the TCO layer. In an implementation, the optical layer comprises at least one other TCO layer.

In an embodiment, a method of manufacturing a photodetector is provided. The method comprising: providing a semiconductor substrate; forming a transparent conducting oxide (TCO) layer on the semiconductor substrate, a thickness of the TCO layer selected to minimize reflection of one or more pre-determined wavelengths of incident photons.

In an embodiment, a method of manufacturing a photodetector is provided. The method comprising: providing a semiconductor substrate; forming a passivation layer on the semiconductor substrate; and, forming a transparent conducting oxide (TCO) layer on the passivation layer.

In an implementation, the method further comprises forming a passivation layer on the semiconductor substrate before forming the TCO layer. The passivation layer may be formed to a pre-determined thickness on the semiconductor substrate. The passivation layer may be formed to a pre-determined composition on the semiconductor substrate.

In an implementation, the method is performed below 300° C.

In an implementation, the method further comprises forming a semiconductor contact on a back surface of the semiconductor substrate, opposed to the TCO layer. The semiconductor contact may comprise a reflective metal.

In an implementation, the method further comprises forming a TCO contact on a portion of the TCO layer.

In an implementation, the method further comprises connecting a voltage bias means to the TCO layer and the semiconductor substrate, wherein the voltage bias means is operative to apply at least one of a forward bias and a reverse bias across the TCO layer and the semiconductor substrate.

In an implementation, wherein before the TCO layer is formed, the method further comprises doping a back surface field region of the semiconductor region with a higher doping concentration, with a same dopant type, than a rest of the semiconductor substrate.

In an implementation of the method the semiconductor is lightly doped n-type.

In an implementation, the method further comprises forming at least one other optical layer located adjacent to the TCO layer, an optical layer thickness and optical layer index of refraction of the optical layer selected to optimize transmission of a pre-defined range of wavelengths of incident photons when the optical layer is combined with the TCO layer. The at least one other optical layer may comprise at least one other TCO layer.

In an implementation, the method further comprises treating at least one of: a photo-receptive surface of the TCO layer, a back surface of the semiconductor substrate opposed from the junction interface, and a semiconductor substrate surface at the junction interface, to improve at least one optical property of that surface.

In an implementation, the method further comprises treating a back surface of the semiconductor substrate opposed from the junction interface to increase reflection of received photons from the back surface back into the semiconductor substrate.

Referring to FIG. 1, in an implementation a photodetector 100 in the form of a heterojunction is presented. In this embodiment, a transparent conductive oxide (TCO) layer 14 with a photo-receptive surface 10 for receiving incident photons is positioned on a semiconductor substrate 18. The TCO layer 14 and the semiconductor substrate 18 meet at a junction interface 34. The semiconductor substrate 18 can have the same, or different conductivity type (e.g. p-type or n-type), as the TCO layer 14. In an embodiment, the semiconductor substrate 18 comprises a lightly doped (e.g. $\sim 1 \times 10^{16}$ carriers/cm$^3$ or less) n-type Silicon (Si) semi-conductor.

Depletion region 30 is a depletion region that is formed when the TCO layer 14 is introduced adjacent to the semiconductor substrate 18 on the junction interface 34. The depletion region 30 may comprise an inversion region and a depletion region or only a depletion region at zero bias, depending upon the specific composition of the TCO layer 14 and the semiconductor substrate 18. Application of a reverse bias across the heterojunction may strengthen, or create in some cases, the inversion region within the depletion region 30. In the case where the semiconductor substrate 18 comprises an n-type semi-conductor, for instance, the reverse bias comprises a negative voltage applied to the TCO layer 14 relative to the semiconductor substrate 18.

In the embodiment of FIG. 1, TCO contact 22 is positioned on surface 10 of TCO layer 14 and semiconductor contact 26 is positioned on the back surface 38 of the semiconductor substrate 18 respectively to form ohimc contact and provide contact locations for application of a bias, from external electronic circuitry (not shown), to the heterojunction. The contacts 22 26 can have different physical shapes, and the shapes illustrated in FIG. 1 are demonstrative only and not intended to be limiting.

The back surface 38 of the semiconductor substrate 18 may be partially or entirely covered by semiconductor contact 26 depending upon requirements. In an embodiment, the back surface 38 of the semiconductor substrate 18 is entirely covered by semiconductor contact 26. In an embodiment the semiconductor contact 26 comprises a metal. In an embodiment, the semiconductor contact 26 is reflective to incident photons.

Photo-receptive surface 10 of the TCO layer 14 may be partially covered by TCO contact 22 as illustrated in FIG. 1, preferably leaving a majority of the photo-receptive surface 10 uncovered to receive incident photons.

In an embodiment, the bias may be applied by electrical connection applied to the side of the structure, rather than the photo-receptive surface 10 of the TCO layer 14.

In an embodiment, the optional back surface field region 42 may be included as an optional layer between the semiconductor substrate 18 and the semiconductor contact 26 to assist with achieving successful ohmic contact between the semiconductor substrate 18 and semiconductor contact 22. In a preferred embodiment, the back surface field region 42 has a same conductivity type as semiconductor substrate 18 but with higher doping concentration. For instance, if the semiconductor substrate 18 comprises a lightly doped n-type semiconductor (e.g. $\sim 1 \times 10^{16}$ carriers/cm$^3$ or less), then the back surface field region 42 may comprise a heavily doped n-type semiconductor (e.g. $\gg 1 \times 10^{16}$ carriers/cm$^3$). In this embodiment, the back surface field region 42 may be operative to capture photons that have traveled through the bulk of the semi-conductor substrate 18.

Incident photons pass through photo-receptive surface 10, travel through TCO layer 14 and are absorbed in the semi-conductor substrate 18. Photons can also travel through semiconductor substrate 18, be reflected at the semiconductor contact interface between the back surface 38 and the semiconductor contact 26 and then be absorbed in the semiconductor substrate 18. Providing a reflective semiconductor contact 26 improves the reflectivity of the semiconductor contact interface, increasing the overall ability of the photodetector to capture incident photons.

TCO layer 14 is a highly conductive material with high energy band gap that is transparent to target photons within an expected wavelength range, and allows the target photons to travel through the TCO layer 14 with minimal absorption by the TCO layer 14. In some embodiments the TCO layer 14 may be generally transparent to a wide range of optical and infrared wavelengths that allows target photons to travel through with minimal absorption by the TCO layer 14 before reaching the junction interface 34.

Semiconductor substrate 18 is the active or detecting layer that absorbs incoming photons and generates free electrons and holes or electron and hole pairs depending upon the semi-conductor type. Semiconductor substrate 18 is preferably lightly doped, so that depletion region 30 can easily have an inversion region form in the depletion region 30. Formation of an inversion region decreases recombination in the semiconductor substrate 18, improving the operation of the photodetector by increasing the current signal produced by the photodetector for a given number of photons captured in the semiconductor substrate 18.

At zero bias across the heterojunction, the formation and strength of the depletion region 30 is determined by the bandgap of the TCO layer 14 and the semiconductor substrate 18, the properties of the TCO layer 14 and the semiconductor substrate 18, the doping concentration of the semiconductor substrate 18, the carrier concentration of the TCO layer 14, and the properties and treatment of the junction interface 34. With the assistance of the depletion region 30, minority carriers in the semiconductor substrate 18 are collected at the junction interface 34 or in the TCO layer 14. Majority carriers in the semiconductor substrate 18 travel through the semiconductor substrate 18 and are collected by semiconductor contact 26. In an embodiment, the photodetector may be operated at zero bias across the heterojunction.

When a forward bias is applied across the heterojunction the depletion region 30 is weakened and shrinks, and the quantum efficiency is decreased. However, when a reverse bias is applied across the heterojunction, the depletion region 30 extends and is strengthened. Therefore, the quantum efficiency is improved. Moreover, the dark current of the heterojunction is limited by the strength of the depletion region 30. The dark current is smaller at reverse bias and larger at forward bias so in a preferred embodiment the photodetector 100 is operated with a reverse bias applied across the heterojunction.

The TCO layer 14 can be manufactured on the semiconductor substrate 18 by way of well known technologies in the art, including, but not limited to, physical vapor deposition, chemical vapor deposition, plasma deposition, the combination of physical and chemical deposition, pulsed laser deposition, thermal evaporation, e-beam evaporation, sputtering, etc.

The TCO contact 22 and the semiconductor contact 26 can be manufactured by way of well known technologies in the art, including, but not limited to, physical vapor deposition, chemical vapor deposition, plasma deposition, the combination of physical and chemical deposition, pulsed laser deposition, thermal evaporation, e-beam evaporation, sputtering, etc.

The back surface field region 42 can be achieved by way of well known technologies in the art, including, but not limited to, ion implantation followed by thermal annealing, diffusion, doped layer deposition, passivation layer formation followed by doped layer formation with subsequent annealing, alloying of the semiconductor substrate 18 and the semiconductor contact 22, etc.

In an embodiment, the TCO layer 14 may be adapted to include either a reflective or anti-reflective function. For example, the thickness of the TCO layer 14 can be designed according to the refractive index of the TCO layer 14, the refractive index of the semiconductor substrate 18, and the specified wavelength(s) of target photons for the photodetector to minimize the reflection of those target photons (anti-reflective). A similar design may be employed to introduce a reflective function to reject target photons. Unlike conventional P-N junction photodiodes which require an additional optical coating to introduce an anti-reflective function since both sides of the junction have the same or similar refractive index, in this embodiment the photodector 100 may incorporate an anti-reflective (i.e. transmittance) function into the TCO layer 14 based on the thickness of the TCO layer 14.

Accordingly, in an embodiment the TCO layer 14 may comprise an interference coating to either reflect or transmit target photons. In an embodiment, the TCO layer 14 may further comprise at least one other optical layer adjacent to the TCO layer 14 to provide for a broadband anti-reflection coating. In the embodiment, the optical layer thickness and the optical layer refractive index may be selected to optimize transmission of a pre-defined range of wavelengths of incident photons into the semiconductor substrate 18 when the optical layer is combined with the TCO layer 14 (having a different TCO layer thickness and TCO layer refractive index). In an embodiment, the at least one other optical layer may comprise at least one other TCO layer, the at least one other TCO layer having a different index of refraction and/or thickness from the TCO layer 14.

In an embodiment, one or more of the photo-receptive surface 10, the semiconductor substrate surface at the junction interface 34, and the back surface 38 may be treated to improve at least one of their optical properties to enhance performance of the photodetector 100.

In an embodiment, at least one of the photo-receptive surface 10, the semiconductor substrate surface at the junction interface 34 and the back surface 38 can be treated to provide at least one of a rough surface, textured surface, nano-structured surface or plasmonic surface so that the light confinement properties of the photodetector are enhanced, i.e. more photons with a desired wavelength will enter or stay in the photodetector to be detected.

In an embodiment, at least one of the photo-receptive surface 10, and the semiconductor substrate surface at the junction interface 34 are treated to have modified surface properties, such as density of states, crystal structures, lattice constant, etc. to enhance the depletion region 30 and therefore improve the responsivity of the photodetector 100.

In an embodiment, the photo-receptive surface 10 is treated by, including, but not limited to, acidic solution, alkaline solution, acidic gas, alkaline gas, neutral gas, plasma, annealing, etc, to minimize photon reflection at surface 10, minimize photon absorption in TCO layer 14, and enhance the depletion region 30 to improve the quantum efficiency of the photodetector 100.

In an embodiment, the semiconductor substrate surface at the junction interface 34 is treated by, including, but not limited to, acidic solution, alkaline solution, acidic gas, alkaline gas, neutral gas, plasma, annealing, etc, to minimize photon reflection at photo-receptive surface 10 and the junction interface 34, minimize photon absorption in the TCO layer 14, enhance the depletion region 30 and improve the quantum efficiency the quantum efficiency of the photodetector 100.

In an embodiment, the back surface 38 is treated by, including, but not limited to, acidic solution, alkaline solution, acidic gas, alkaline gas, neutral gas, plasma, annealing, etc, to increase photon reflection at the back surface 38 and minimize carrier recombination at the back surface 38 and improve the quantum efficiency the quantum efficiency of the photodetector 100.

In some embodiments, the TCO layer 14 may comprise a Transparent Conductive Oxide (TCO), including, but not limited to, Zinc Oxide (ZnO), doped ZnO, co-doped ZnO, tin oxide ($SnO_2$), Indium Tin Oxide (ITO), doped and co-doped Tin Oxide, indium oxide ($In_2O_3$), etc. The TCO layer 14 may also be comprised of transparent conductive polymers, carbon nanotube network based transparent conductive films, graphene based transparent conductive films, etc.

In some embodiments, the semiconductor substrate 18 may comprise an elemental semiconductor, compound semiconductor, crystalline semiconductor, amorphous semiconductor, doped semiconductor, thin film semiconductor, nanostructured semiconductor, composition graded semiconductor, etc.

In some embodiments, the TCO contact 22 and the semiconductor contact 26 may comprise a metal, alloy, conductive semiconductor, conductive oxide, conductive polymer, conductive nanostructure, conductive nanoparticals, conductive nanowires, nanotube, graphene, graphene oxide, conductive organic film, etc.

In one specific example of the photodetector 100, the TCO layer 14 comprises an n-type Aluminium doped Zinc Oxide (AZO), the semiconductor substrate 18 comprises a lightly doped n-type crystalline silicon wafer, the TCO contact 22 and the semiconductor contact 26 comprise aluminium. In some implementations, the back surface field region 42 may, optionally, be omitted. In this example, only three layers of components need to be positioned on the silicon substrate 18 to complete the photodector 100. Moreover, all layers may be fabricated with low temperature processes.

Figure 2:
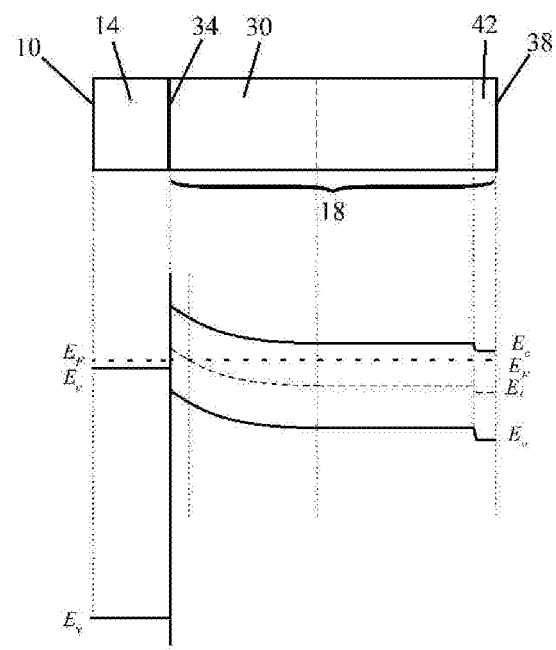
FIG. 2 shows the energy bands as a function of depth from the top surface of the device at zero bias condition for the photodetector of FIG. 1.

FIG. 2 is a simplified section view along a cut line 7-7' of photodetector 100 (turned 90°) in FIG. 1, illustrated in juxtaposition with an example of corresponding simplified energy band diagrams under zero bias. In an energy band diagram, $E_c$ is conduction band energy, $E_v$ is the valence band energy, $E_g$ is the difference between $E_c$ and $E_v$. $E_F$ is the Fermi energy of the material, where the probability of occupation by a charge carrier is equal to 50%. $E_i$ is the intrinsic energy which is the Fermi energy $E_F$ corresponding to a nominally undoped material, or a material with an equal number of electron and holes.

As is well-known in the art, when $E_F$ is between $E_c$ and $E_i$, the semiconductor material is n-type or exhibits n-type behavior; when $E_F$ is between $E_i$ and $E_v$, the semiconductor material is p-type or exhibits p-type behavior. $E_F$ of a degenerated n-type material is above $E_c$.

In this embodiment, the $E_F$ of TCO layer 14 is "pinned" in between $E_c$ and $E_v$ of substrate 18 by way of, including, but not limited to, Schottky-Mott rule, Energy Pinning Effect, energy band engineering, surface state engineering, surface defect density engineering, etc. The positioning of $E_F$ of TCO layer 14 relative to $E_c$ and $E_v$ of the semiconductor substrate 18 is determined by the bandgap of TCO layer 14 and substrate 18, the properties of TCO layer 14 and the semiconductor substrate 18, the doping concentration of the semiconductor substrate 18, the carrier concentration of the TCO layer 14, and the properties and treatment of the junction interface 34.

Hence, under equilibrium conditions (i.e. zero bias), $E_F$ is slightly above $E_c$ in the TCO layer 14, and then "pinned" to a certain position relative to $E_c$ and $E_v$ of the semiconductor substrate 18 at the junction interface 34. $E_F$ of substrate 18 is close to $E_c$. To maintain the $E_F$ at the same level throughout photodetector 100 under equilibrium conditions, $E_c$, $E_v$ and $E_i$ of the semiconductor substrate 18 bend upward from the edge of region 30 to surface 34. $E_i$ of the semiconductor substrate 18 can intersect with $E_F$ within the depletion region 30 due to the energy band bending, and create an inversion region (here, p⁻ region) in the depletion region 30. If $E_i$ of the semiconductor substrate 18 does not intersect with $E_F$ within the depletion region 30, then there is only a depletion region and no inversion region. Therefore, the depletion region 30 has the ability to assist with photo-generated carrier collection. The energy barrier between $E_F$ of the TCO layer 14 and $E_c$ of the semiconductor substrate 18 blocks the flow of majority carriers between the TCO layer 14 to the semiconductor substrate 18.

In embodiments where the photodetector 100 is reverse biased, the depletion region 30 extends towards the back surface 30 of the semiconductor substrate 18. Application of a reverse bias across the heterojunction strengthens the depletion region 30, and in some cases the inversion region within the depletion region 30, which benefits photo-generated carrier collection and hence increases photocurrent produced from incident photons.

The energy barrier between $E_F$ of the TCO layer 14 and $E_c$ of the semiconductor substrate 18 can be unchanged, or changed only slightly, and still block the flow of majority carriers from the TCO layer 14 to the semiconductor substrate 18. Therefore, the dark current of the photodetector 100 under reverse bias can be very small, lowering the noise for photo-detection.

From the energy band diagrams deduced by the inventors, the photodetector 100 actually operates as a Schottky junction-like structure. This is contrary to the understanding in the prior art that assumed the heterojunction performed as a P-N junction. Hence, surprisingly, the photodetector 100 operates with a high switching speed and low reverse recovery time. Since the heterojunction has a similar layout to a P-N junction, the photodetector 100 also has an active area to device area ratio that is comparable to a P-N junction, and as a result higher than the active area to device area ratio associated with Shottky junctions.

Figure 3:
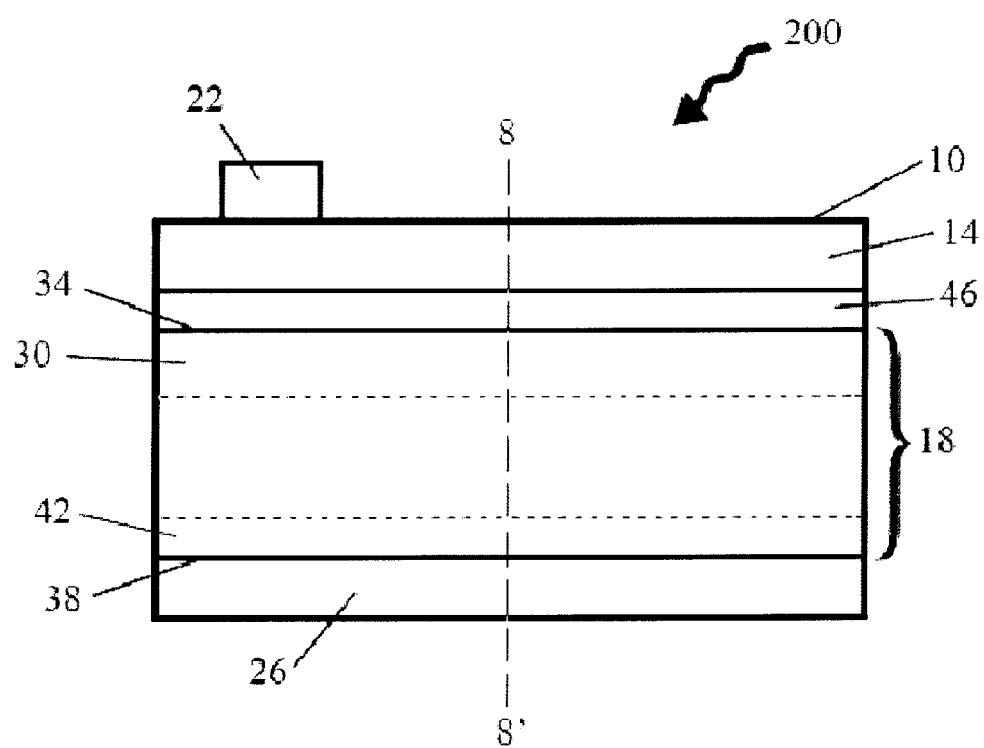
FIG. 3 shows a simplified sectional view of another photodetector in accordance with another embodiment of the present invention.

FIG. 3 is simplified sectional view of a photodetector 200 in accordance with an embodiment of the present invention. The photodetector 200 is formed with a passivation layer 46 added between the TCO layer 14 and the semiconductor substrate 18 as a specific manufacturing step. The rest of the layers and regions in FIG. 3 have the same meanings and assignments as those in the discussion of the photodetector 100 embodiment from FIG. 1 described above.

Passivation layer 46 is an intentionally manufactured layer introduced between the TCO layer 14 and the semiconductor substrate 18. Being intentionally manufactured, the passivation layer 46 is of consistent thickness and composition as determined by the design. As a designed and manufactured layer, the passivation layer 46 is to be distinguished from unintentional or byproduct layers, such as oxide layers, which may inadvertently result from imperfect semiconductor fabrication processes. For instance, Song et al. 2003 describe the appearance of a12 Angstrom thick amorphous silicon oxide layer at the interface of a Si wafer and ZnO:Al film despite no interlayer being intentionally grown. It is posited that the uneven amorphous silicon oxide layer resulted from natural oxidation occurring during the initial pump down. Such an unitential oxide layer is of varying, and uncontrolled, thickness and composition. The unintentional oxide layer of Song et al. 2003 was an observed, but not desired, structural feature of their ZnO:Al film.

During manufacture, the passivation layer 46 may be formed on the semiconductor substrate 18 before formation of the TCO layer 14. The passivation layer 46 formed to a designed thickness and/or composition. This manufacturing process is distinguished from the unintentional oxidation created during the pump down that results in an uneven, and uncontrolled oxidation layer of indeterminate thickness and composition.

Introducing the passivation layer 46 can surprisingly improve operation of the photodetector 200 compared to the photodetector 100 due to, including, but not limited to:
  optical properties, for example, lower reflection, better wavelength selectivity, better viewing angle, better appearance, etc;
  electrical properties, for example, achieving more stable and/or stronger region 30, improving photo-generated carrier collection, reducing dark current, reducing photo-generated carrier recombination, optimizing the pinning position of $E_F$ of TCO layer 14, assisting photo-generated carrier traveling through surface 34, enabling faster operation of junction 200, etc;
  fabrication efficiencies, for example, increasing deposition rate of TCO layer 14, improving the properties of TCO layer 14, simplifying the positioning of TCO layer 14, simplifying the treatment for TCO layer 14, etc.

The passivation layer 46 can be formed, for instance, from a wide bandgap material, narrow bandgap material, energy bandgap engineered material, crystalline material, amorphous material, micro-structured material, nano-structured material, porous structured material, elementary material, compound material, alloy material, intrinsic material, doped material, etc. In some embodiments, the passivation layer 46 can be formed from a region of the semiconductor substrate 18, for example by oxidation, etching, passivation, doping, polishing, texturing, etc.

In some embodiments, the passivation layer 46 can be deposited on the semiconductor substrate 18 by way of well known technologies in the art, including, but not limited to, physical vapor deposition, chemical vapor deposition, plasma deposition, the combination of physical and chemical deposition, pulsed laser deposition, thermal evaporation, e-beam evaporation, sputtering, atomic alignment, etc. Passivation layer 46 can be formed by multiple sub-layers with the same or different materials, structures, components to passivate the junction interface 34 and/or enhance the depletion region 30 to optimize the performance of the photodetector 200.

The controlled thickness of the manufactured passivation layer 46 may be selected as a tradeoff between passivation, i.e. reduced dark current, and current loss, i.e. reduced sensitivity of the photodetector 200.

The thickness of the passivation layer 46 may, in some embodiments, be less than about 10 nm. In some embodiments the thickness of the manufactured passivation layer 46 is less than about 2 nm. In some embodiments the thickness of the manufactured passivation layer 46 is selected to be a value between about 1-2 nm. In these embodiments, the thickness of the passivation layer 46 is selected to provide reduced dark currents with minimal current loss.

In some embodiments, where dark current reduction is of more importance than current loss for instance, the passivation layer may be relatively larger than 10 nm, for instance of the order of 50-100 nm, or even larger (e.g. up to 500 nm) though at the cost of additional current loss.

In some embodiments, passivation layer 46 can be, including, but not limited to, semiconductor oxide, metal oxide, doped metal oxide, semiconductor nitride, semiconductor compound, nanostructured material, amorphous thin film, crystalline thin film, organic thin film, graphene, graphene based thin film, graphene oxide, etc.

In one specific example of the photodetector 200, the TCO layer 14 comprises an n-type Aluminium doped Zinc Oxide (AZO); the passivation layer 46 comprises an ultra-thin silicon oxide; the semiconductor substrate 18 comprises a lightly doped n-type crystalline silicon wafer; and, the TCO contact 22 and the semiconductor contact 26 can be aluminium; the back surface field region 42 may, optionally, be not included. In this example, only four layers of components need to be positioned on silicon substrate to complete the photodiode. Moreover, all layers of the photodetector 200 can be fabricated with low temperature processes.

Figure 4:
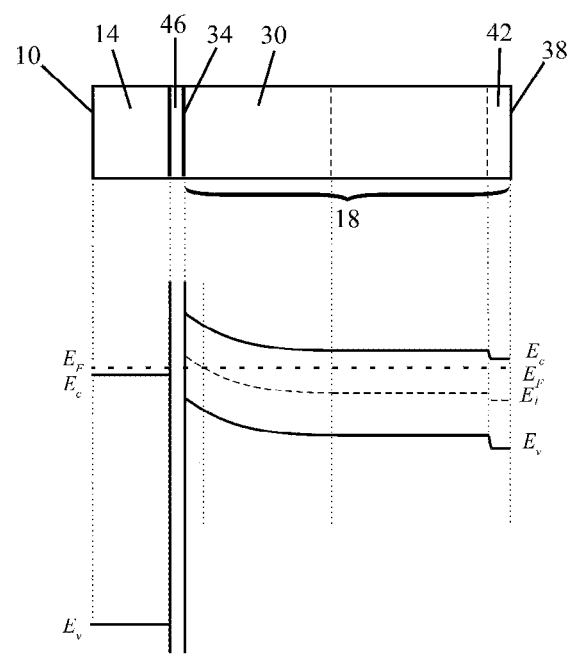
FIG. 4 shows the energy bands as a function of depth from the top surface of the device at zero bias condition for the photodetector of FIG. 3.

FIG. 4 is a simplified sectional view along a line 8-8' of the photodetector 200 (turned 90°) in FIG. 3 juxtaposed with corresponding simplified energy band diagrams under zero bias, as deduced by the inventors. The descriptions associated with the photodetector 100 and FIG. 2 above may be applied to this structure as well. In addition, the position relative to $E_c$ and $E_v$ of substrate 18 where $E_F$ of TCO layer 14 is "pinned" can be determined by the combination effect of TCO layer 14 and layer 46. Hence, layer 46 can be designed to optimize and tune the pinning position of $E_F$ of TCO layer 14, and also to optimize and tune the strength and depth of region 30. Under reverse bias, $E_F$ of TCO layer 14 may not be "pinned" perfectly still to the position as there was zero bias due to the insertion of the passivation layer 46. However, region 30 maintains to assist the photo-generated carrier collection. The passivation layer 46 can be designed or selected to enable photo-generated minority carrier in substrate 18 to travel from substrate 18, through surface 34 to TCO layer 14 or recombine in layer 46 and TCO layer 14, which improves the photocurrent of photodetector 200. Also, the passivation layer 46 can be designed or selected to block majority carrier travel from TCO layer 14 to the semiconductor substrate 18, which further reduces the dark current of the photodetector 200.

From the energy band diagrams of FIG. 4, the photodetector 200 is similarly a Schottky junction-like structure. Hence, surprisingly, the photodetector 200 operates with a high switching speed and low reverse recovery time. Since the heterojunction has a similar layout to a P-N junction, the photodetector 200 also has an active area to device area ratio that is comparable to a P-N junction, and as a result higher than the active area to device area ratio associated with Shottky junctions.

Figure 5:
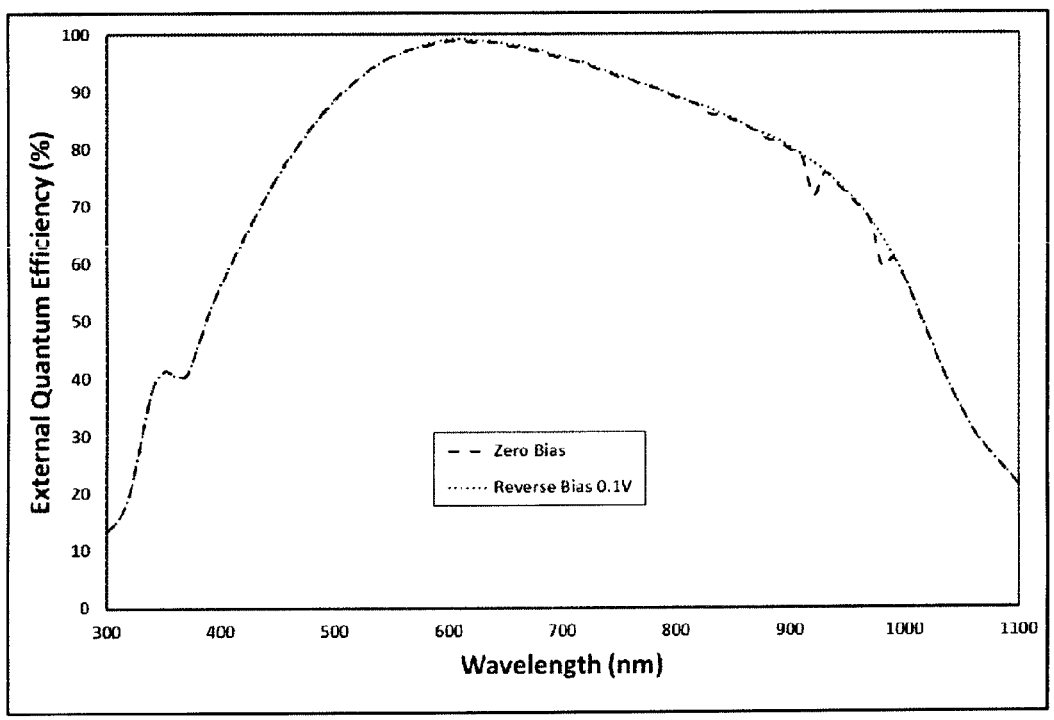
FIG. 5 shows the external quantum efficiency of the photodetector of FIG. 3 at zero bias and reverse bias of 0.1 V.

FIG. 5 is a graph showing the external quantum efficiency of an embodiment of a photodetector in accordance with the present invention in the spectral range from 300 nm to 1100 nm at zero bias and at 0.1 V of reverse bias (applied between contacts 22 and 26) at room temperature. In this example, the material and thickness of the TCO layer 14 are selected to have optimum quantum efficiency at around 600 nm wavelength. The external quantum efficiency value in FIG. 5 indicates that this embodiment of a photodetector provides higher photoresponsivity in comparison with prior art devices.

Figure 6:
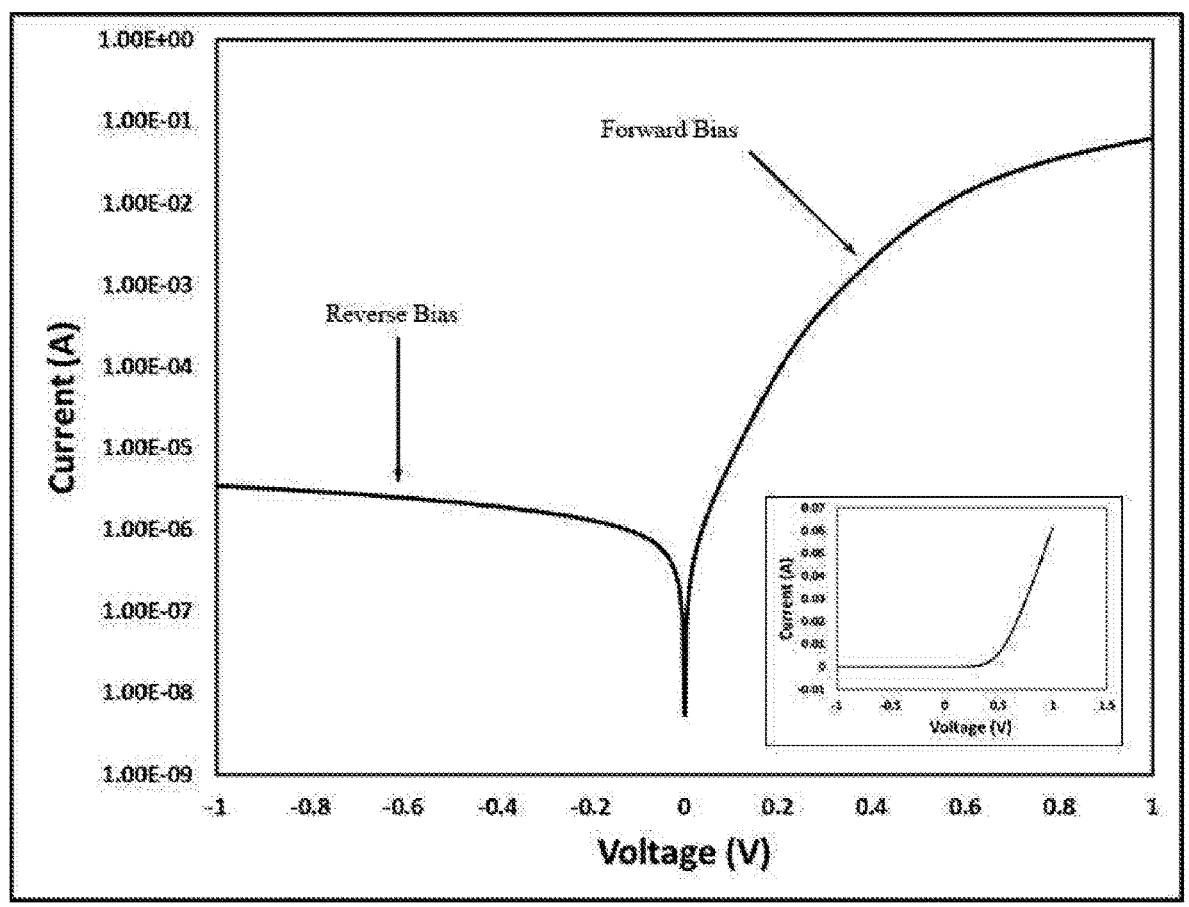
FIG. 6 shows the current versus voltage plot of the photodetector of FIG. 3.

FIG. 6 is a graph showing the current versus voltage applied between TCO contact 22 and semiconductor contact 26 at room temperature for a photodetector in accordance with an embodiment of the present invention, with no optical illumination. The reverse bias current saturates at about −3.5 μA, when the junction area is about 2.2 cm by 2.2 cm. Hence, the current versus voltage curve in FIG. 6 indicates that for a given area, this embodiment of the photodetector provides much less dark current in comparison with prior art devices.

The present invention teaches a novel photodetector and method of making thereof. Embodiments of a photodetector in accordance with the present invention allow for high speed switching because of its low reverse recovery time. Embodiments of a photodetector in accordance with the present invention have a high responsivity because a lightly doped heterojunction has less photogenerated carrier recombination at the emitter comparing to conventional P-N junction photodetectors. Embodiments of a photodetector in accordance with the present invention have a high active area to device area ratio, close to 100%, optimizing device performance for a given device area. Embodiments of a photodetector in accordance with the present invention can be easily fabricated with low temperature manufacturing techniques (e.g. below 300° C., typically in the range of room temperature to about 250° C.) avoiding the need for high temperature fabrication processes (e.g. above 500° C., typically in the range of 800° C.-1000° C.).

In some embodiments, a photodetector in accordance with the present invention can be compatible with CMOS fabrication processes and hence can be integrated on a CMOS chip. In some embodiments, a photodetector in accordance with the present invention can be integrated to a circuit on a PCB board. In one example of the applications of the present invention, a photodetector in accordance with the present invention can be applied as an imaging sensor for cameras. In another example of the applications of the present invention, a photodetector in accordance with the present invention can be applied as a sensor for optical communication.

The embodiments of the invention described herein are exemplary and numerous modifications, variations and rearrangements can be readily envisioned to achieve substantially equivalent results, all of which are intended to be embraced within the spirit and scope of the invention.

The invention claimed is:
1. A photodetector comprising:
a transparent conductive oxide (TCO) layer for receiving incident photons; and,
a semiconductor substrate for capturing and detecting the received photons, the TCO layer positioned on the semiconductor substrate such that TCO layer and semiconductor substrate meet at a junction interface;
the TCO layer combined with the semiconductor substrate at the junction interface to form a heterojunction; and a TCO layer thickness selected to minimize reflection of one or more predetermined wavelengths of the incident photons.

2. The photodetector of claim 1 further comprising a voltage bias applied across the heterojunction.

3. The photodetector of claim 2, wherein the voltage bias comprises a reverse bias.

4. The photodetector of claim 1, wherein the semiconductor substrate is lightly doped n-type.

5. The photodetector of claim 1, further comprising a depletion region in the semiconductor substrate adjacent to the junction interface.

6. The photodetector of claim 5, wherein the depletion region further comprises an inversion region.

7. The photodetector of claim 1, further comprising a back surface field region of the semiconductor substrate opposite from the junction interface, wherein the back surface field region is more heavily doped, with a same dopant type, than a rest of the semiconductor substrate.

8. The photodetector of claim 1, further comprising a semiconductor contact covering a back surface of the semiconductor substrate, opposed from the junction interface.

9. The photodetector of claim 8, wherein the semiconductor contact comprises a reflective material for reflecting the received photons.

10. The photodetector of claim 8, further comprising a contact formed on a surface of the TCO layer opposite the junction interface, such that the photodetector has only three layers of components on the semiconductor substrate.

11. The photodetector of claim 1, wherein at least one of:
a photo-receptive surface of the TCO layer,
a back surface of the semiconductor substrate opposed from the junction interface,
and a semiconductor substrate surface at the junction interface, have been treated to improve at least one optical property of that surface.

* * * * *